(12) United States Patent
Karanovic

(10) Patent No.: US 6,301,596 B1
(45) Date of Patent: Oct. 9, 2001

(54) PARTIAL SUM FILTER AND METHOD THEREFORE

(75) Inventor: Marinko Karanovic, Don Mills (CA)

(73) Assignee: ATI International Srl, Christ Church (KN)

( * ) Notice: Subject to any disclaimer, the term of this patent is extended or adjusted under 35 U.S.C. 154(b) by 0 days.

(21) Appl. No.: 09/283,693

(22) Filed: Apr. 1, 1999

(51) Int. Cl.[7] ................................................ G06F 17/10
(52) U.S. Cl. ................................. 708/319; 708/306
(58) Field of Search ................................. 708/319, 306, 708/313, 250

(56) References Cited

U.S. PATENT DOCUMENTS

| | | | |
|---|---|---|---|
| 4,727,506 | * | 2/1988 | Fling ..................................... 708/306 |
| 5,297,069 | * | 3/1994 | Asato et al. ......................... 708/319 |
| 5,404,427 | | 4/1995 | Cawley et al. . |
| 5,648,777 | * | 7/1997 | Bays et al. ........................... 708/313 |
| 5,904,731 | * | 5/1999 | Matsui ................................. 708/319 |
| 6,173,003 | * | 1/2001 | Whikehart et al. ................... 708/250 |

OTHER PUBLICATIONS

"Digital Image Processing," Pratt; pp. 618–621.
"Handbook of Digital Signal Processing Engineering Applications," Harris; pp. 251–252.

* cited by examiner

Primary Examiner—David H. Malzahn
(74) Attorney, Agent, or Firm—Vedder, Price, Kaufman & Kammholz

(57) ABSTRACT

A method and apparatus for performing filtering operations on video data using a limited amount of memory is accomplished by multiplying a first coefficient value and a first input value to produce a product. A random number is generated and added to the product to produce a dithered product. The dithered product is added to an accumulated value to produce a partial sum. A truncated version of the partial sum is stored in a buffer as the new accumulated value. The multiply and add operations are repeated for a number of coefficient values and input values such that the accumulated value includes contributions from a number of different input values. The resulting accumulated value is provided as an output.

20 Claims, 5 Drawing Sheets

PARTIAL SUM FILTER AND METHOD THEREFORE

FIELD OF THE INVENTION

The invention relates generally to video graphics processing and more particularly to a partial sum FIR filter used in scaling operations.

BACKGROUND OF THE INVENTION

Video graphics images provided to a display often require scaling prior to output. This is because the images may have been generated with an aspect ratio that differs from that of the display. For example, a window within a display may be used to display an image that was originally generated for a much wider or much taller window. As such, the images must be scaled accordingly to fit the desired display window.

When downscaling an image, a number of individual pixels are often combined to create an output pixel. The input pixels are typically weighted according to their proximity to the relative location of the output pixel. For example, in a decimation filter that converts three pixels to a single output pixel, the weighting of the central or middle pixel of the three may be greater than the weighting of the peripheral pixels. Therefore, filtering operations typically involve a number of coefficients that determine the weighting of input values that correspond to the input pixels.

In order to perform the filtering functions required for scaling, partial sum finite input response (FIR) filters are often employed. The advantage of these filters is that a single multiplier and adder can be used to combine a number of different coefficients and input values by storing a partial sum in a buffer that is added to the next product produced by multiplying the following coefficient and pixel values. Some of the advantages of these filters can be lost when integer values are used as input values and coefficients. This is because the storage requirements for a product resulting from the multiplication of an M-bit coefficient by an N-bit input value is M+N bits. When it is taken into account that the number of pixels in a single display line may exceed 1,000 pixels, the memory or register requirements to buffer the partial sums required to perform the filtering operations can be substantial.

One solution to the problem presented by the large memory requirements is to only store a portion of the bits making up the partial sum. However, this requires truncation of the partial sum. The truncation of the partial sum can result in artifacts in the display that are undesirable. This is especially true along portions of the display where a ramp-type function exists. When truncation occurs along a ramp, a number of steps can be created due to the truncation. These steps or discrete jumps between values resulting from truncation can be visible on the display, and are undesirable.

Therefore, a need exists for a partial sum FIR filter that has a reduced memory requirement for storing partial sums, but does not produce the visual aberrations associated with truncation.

DETAILED DESCRIPTION OF A PREFERRED EMBODIMENT OF THE INVENTION

Generally, the present invention provides a method and apparatus for performing filtering operations on video data using a limited amount of memory. This is accomplished by multiplying a first coefficient value and a first input value to produce a product. A random number is generated and added to the product to produce a dithered product. The dithered product is added to an accumulated value to produce a partial sum. A truncated version of the partial sum is stored in a buffer as the new accumulated value. The multiply and add operations are repeated for a number of coefficient values and input values such that the accumulated value includes contributions from a number of different input values. The resulting accumulated value is provided as an output, where the dithering induced by the addition of the random number removes step-like artifacts that would normally result from truncation of the partial sum.

By allowing the product of the coefficient value and the input value to be stored in a buffer that is of reduced size, the memory requirements for each filtering block are greatly reduced. In a filter that includes a large number of filtering blocks, the memory savings can be substantial. The addition of the random number, which is effectively evenly distributed noise, into the filtering operation provides the effect of removing the abrupt steps that often occur when a video image includes a ramp, or gradual change, that becomes a staircase type pattern due to truncation.

Figure 1:
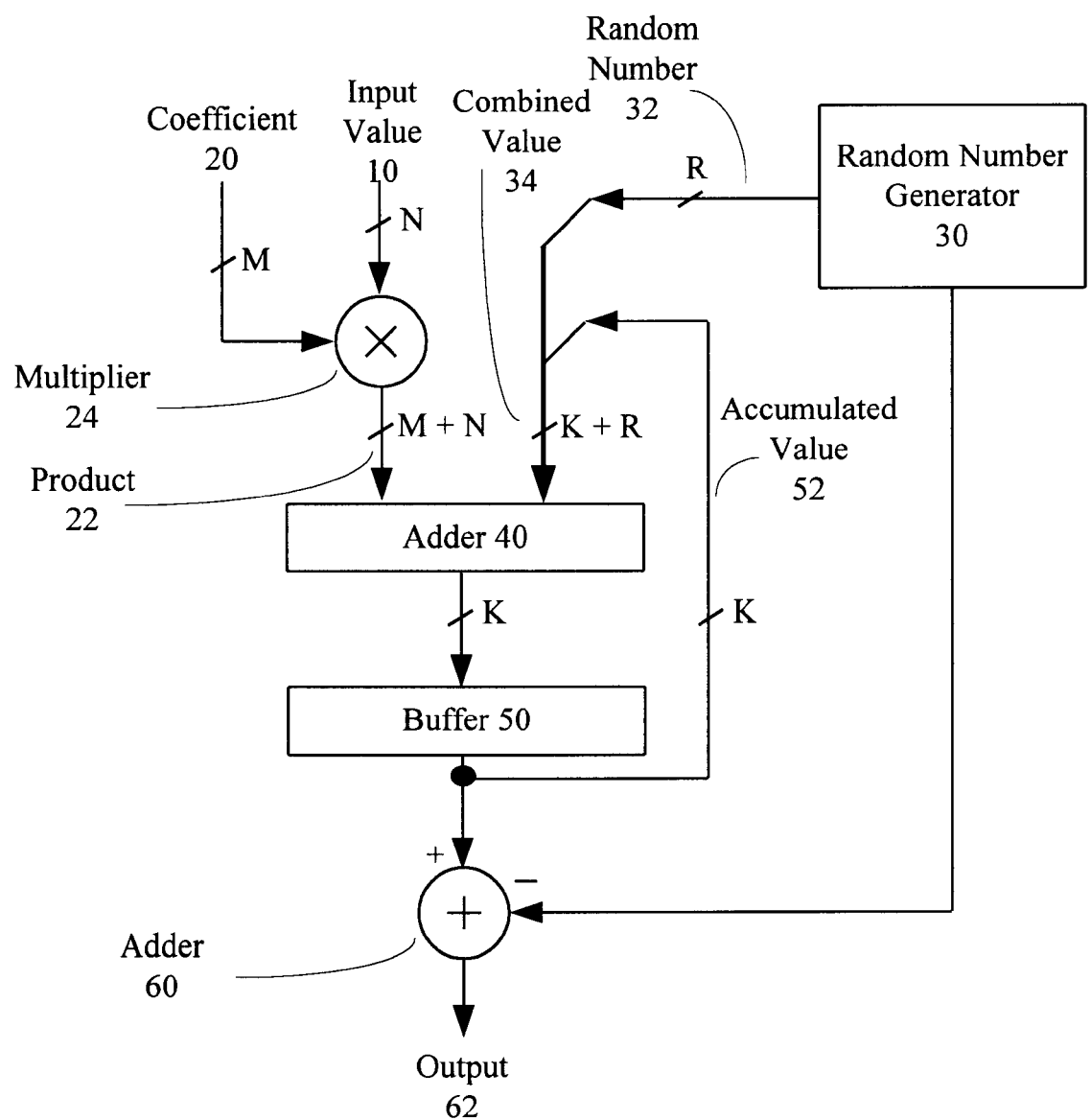
FIG. 1 illustrates a block diagram of a partial sum filter block in accordance with the present invention.

The invention can be better understood with reference to FIGS. 1–5. FIG. 1 illustrates a partial sum filter block that includes a multiplier 24, a random number generator 30, an adder 40, a buffer 50, and preferably a second adder 60. The filter block receives an input value 10, which is preferably an N-bit value, and more preferably is an N-bit value corresponding to a particular pixel at a particular pixel location in a line of image data. The multiplier 24 multiplies the input value 10 by a coefficient value 20. Preferably, the coefficient 20 is an M-bit coefficient value, and more preferably, the coefficient is the coefficient associated with the particular weighting to be given to the pixel provided by the input value 10 in a scaling operation. The coefficient 20 may be stored in a register.

The multiplier 24 multiplies the coefficient 20 in the input value 10 to produce a product 22. Assuming that the coefficient is an M-bit integer value, and the input value 10 is an N-bit integer value, the product 22 will include M+N bits.

The random number generator 30 generates a random number 32. Preferably, the random number generator 30 is in actuality a pseudo-random number generator, the design and operation of which is well known in the art. The random number 32 generated by the random number generator 30 is preferably an R-bit random number.

The random number 32 is combined with an accumulated value 52 to produce a combined value 34. The accumulated value 52 is the prior sum of the partial sums that have been generated by the partial sum filter block in previous iterations. Preferably, the accumulated value 52 is a K-bit value. The K-bits of the accumulated value preferably make up the most significant K-bits of the combined value 34, whereas the R-bits of the random number 32 make up the least significant bits of the combined value 34. More preferably, the number of bits in the combined value 34 (K+R) is equal to the number of bits in the product 22 (M+N).

The adder 40 receives the product 22 and the combined value 34 and adds the two values to produce a partial sum. Although the partial sum includes a number of bits greater than K, only K-bits of the partial sum are stored in the buffer 50. In one embodiment, the number K is equal to the number of bits in the input value (N). Preferably, the most significant K-bits of the sum produced by the adder 40 are stored in the buffer 50. These K-bits are then provided as the accumulated value 52 for the next iteration of the filter block.

The truncation performed by the storage of only a portion of the sum of the adder 40 and the buffer 50 would normally result in the step like artifacts when a ramping type image was displayed. However, the noise, or randomness, induced by adding the random number 32 in the adder 40 replaces the discreet steps of the staircase function. Instead of periodic jumps from one value to another at single pixel points, a number of small steps at a number of pixel locations will occur. These multiple steps are perceived to be a gradual blending rather than an obvious step-change.

Note that the buffer 50 may stored even fewer than N-bits, where the input value is an N-bit quantity. The amount of storage included for the buffer 50 may depend on the particular application involved, and the degree to which digital artifacts can be tolerated. The partial sum filter block illustrated in FIG. 1 may be included in a vertical-scaler of a video signal processing circuit. Partial sum filters are known for their memory efficiency, as the only storage implemented is for storage of the partial sum, which eventually becomes the accumulated value provided as the output. As such, the input values do not require continuous storage, but rather are often stepped through a line buffer, where the line buffer feeds a number of different filtering blocks. As such, the input values can be used a number of times without requiring continuous storage, or continuous fetching from their source.

Because the noise induced by the addition of the random number 32 is positive, it can induce a level shift in the eventual output value. As such, a second adder 60 may be included in the system to try and remove some of this offset or level shift. The adder 60 subtracts at least a portion of a random number provided by the random number generator 30 from the accumulated value 52 to produce an output value 62. Preferably, the value subtracted from the accumulated value 52 is a random number having a maximum value of one-half of the value of the least significant bit location of the accumulated value. In operation, the amount of level shift or offset induced by the random number 32 is often negligible, and therefore the adder 60 may be omitted from the circuit entirely.

A number of iterations using a number of different input values and coefficients will be performed to produce an output value 62. For example, for a 5-tap filter, five input values will be used to generate a single output value. During these iterations, the accumulated value will store the partial sums of each operation such that when the final iteration is complete, the accumulated value 52 will store the sum of all the different combination operations involving all of the input values. Once the accumulated value 52 has been captured as an output signal following the final iteration, the buffer 50 is cleared in preparation for a subsequent operation.

Figure 2:
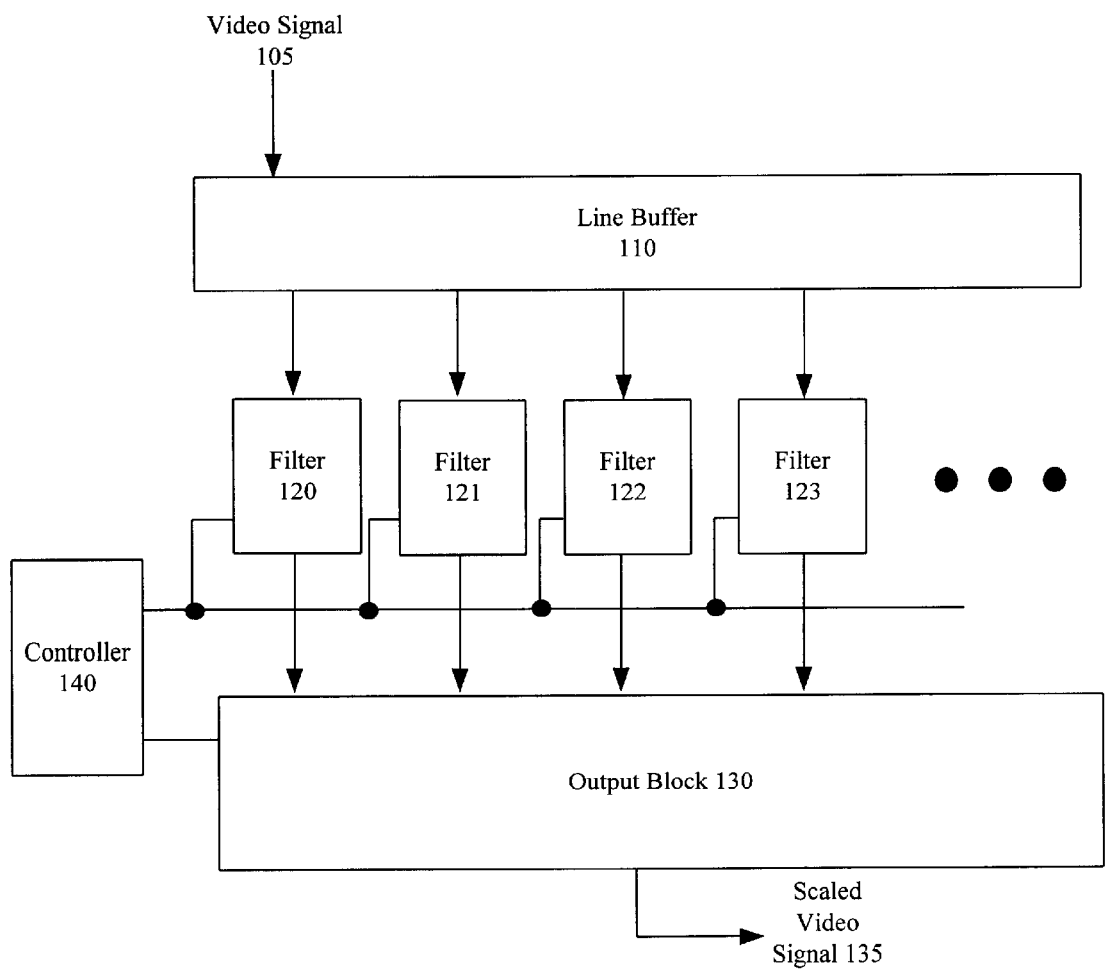
FIG. 2 illustrates a block diagram of a vertical-scaling block in accordance with the present invention.

FIG. 2 illustrates a vertical scaling block for vertical scaling block for vertical scaling of a video signal 105. The vertical scaling block includes a line buffer 110, a plurality of filter blocks 120–123, an output block 130, and a controller 140. The line buffer 110 stores a portion of the video signal. It may store a single line or a number of lines depending on the actual implementation.

Preferably, each of the plurality of filter blocks 120–123 includes a partial sum block as illustrated in FIG. 1. As such, each of the filter blocks 120–123 receives a component of the portion of the video signal stored in the line buffer. More preferably, each of the filter blocks 120–123 receives a pixel value corresponding to a particular pixel location and a line stored within the line buffer 110.

Each of the plurality of partial sum blocks included in the filter blocks 120–123 preferably includes a multiplier, a random number generator, a first adder, and a buffer. In another embodiment, the filter blocks 120–123 share a single random number generator such that the same random number is used in each partial sum block. These components are as illustrated in FIG. 1.

As was described in FIG. 1, the multiplier receives a coefficient value, which may be stored in a register, and the component of the portion of the video signal 105 stored in the line buffer 110. The multiplier multiplies the coefficient value by the component portion to produce a product. The random number generator generates a random number, which may be a pseudo-random number. The adder included in the partial sum block adds the product produced by the multiplier with the random number and an accumulated value to produce a partial sum. As before, the random number and the accumulated value are combined such that the accumulated value occupies the most significant bits whereas the random number occupies the least significant bits of the number that is added to the product.

A portion of the partial sum that is produced by the adding operation is stored in a buffer. As before, the buffer stores only a portion of the partial sum such that truncation of the partial sum occurs. The portion of the partial sum stored in the buffer is the accumulated value. The accumulated value of each operation is used in the subsequent addition function such that the accumulated value receives contributions from a number of component portions. Once a sufficient number of iterations have been performed by the filtering blocks 120–123, the outputs of these blocks are captured by the output block 130. When the output of a particular filtering block is captured, the buffer associated with that filter is cleared in preparation for a following filtering operation.

It should be noted that the number of filtering blocks included in the vertical scaling block will likely be based on the resolution of the video image data being processed. And as such, the number of filtering blocks illustrated in FIG. 2 is for discussion purposes only, and it should be understood that many more filtering blocks would typically be present in an actual embodiment.

As was described with respect to FIG. 1, each of the filtering blocks 120–123 may include a second adder which subtracts the offset, or level shift, which may be induced by the addition of the random number. Preferably, the controller 140 determines when the output of each filtering block 120–123 is captured by the output block 130 and when each of the buffers within the filtering blocks 120–123 is cleared. Once the outputs of the filtering blocks 120–123 are captured, the outputs are combined to produce a scaled video signal 135.

Figure 3:
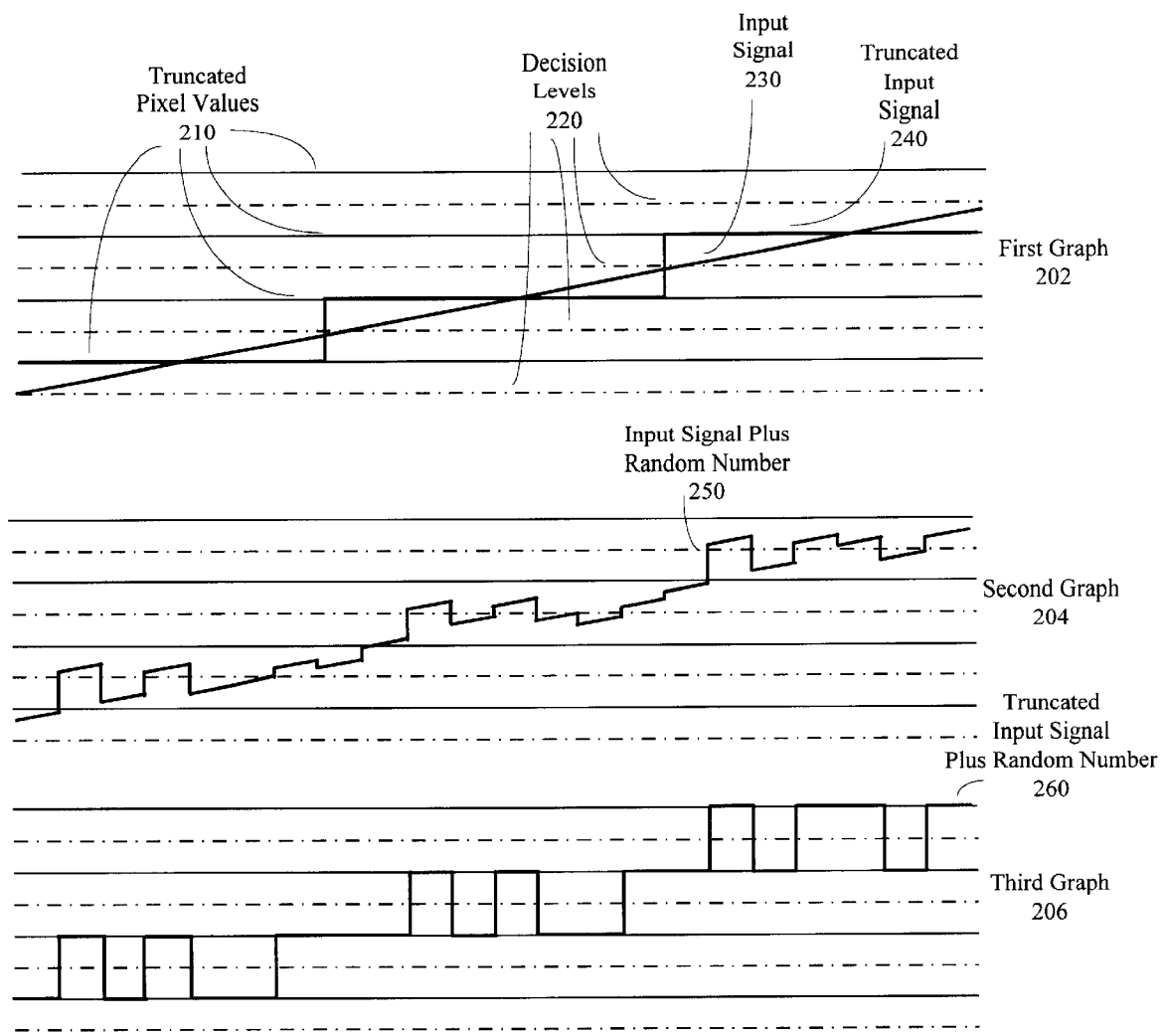
FIG. 3 illustrates a number of graphs depicting video signals in accordance with the present invention.

FIG. 3 illustrates three graphs 202–206 that help to illustrate the dithering effect produced by the addition of the random number to the partial sum filtering blocks. The first graph 202 shows an input signal 230 superimposed over a set of decision levels 220 that determine which of a set of truncated pixel values 210 are used to represent the signal.

When the signal goes above one of the decision levels 220, the truncated input signal 240 will move to the next truncated pixel value 210. As such, the staircase effect of truncation is clearly visible when the input signal 230 is truncated to produce the truncated input signal 240. The resulting steps are often visible in the resulting image, and are undesirable.

The second graph 204 shows a plot of the input signal plus a random number 250. The random number adds noise, or dithering, that in some cases is great enough to move a portion of the input signal above one of the decision levels 220, which causes the staircase pattern of the truncated input signal 240 to be interrupted. The resulting truncated input signal that includes the random number 260 is illustrated in the third graph 206. As can be seen, the staircase pattern has been broken up, which when perceived by a viewer, results in the perception of a gradual blending from one level to the next. Thus, even though a reduced number of bits are utilized to represent the truncated input signal, the addition of the random number prior to truncation avoids the staircase pattern artifacts that normally occur.

Figure 4:
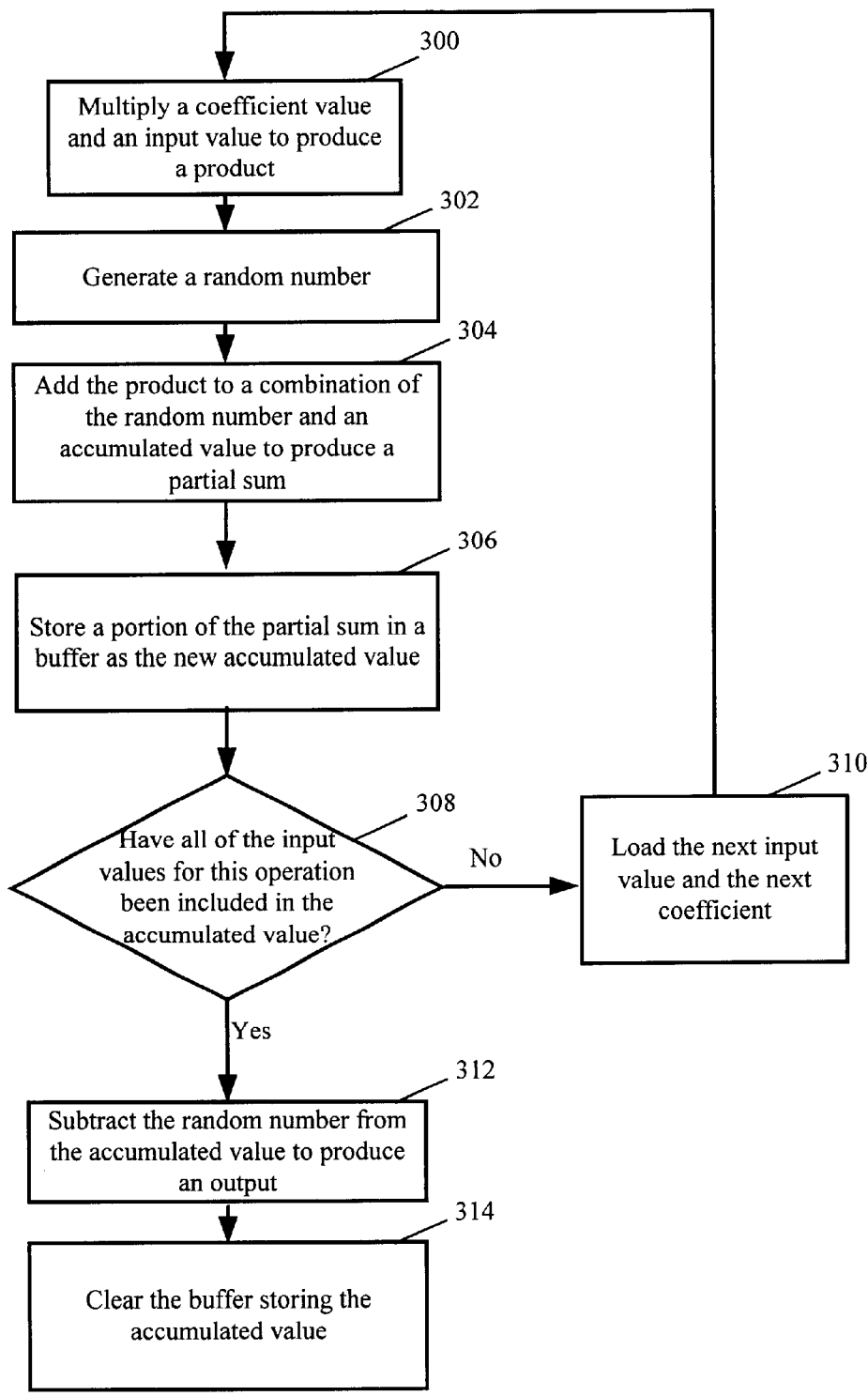
FIG. 4 illustrates a flow diagram of a method for filtering a data set in accordance with the present invention.

FIG. 4 illustrates a method that can be utilized to filter a data set, which may correspond to portions of video data. At step 300, a coefficient value is multiplied by an input value to produce a product. Preferably, the coefficient value is stored in a register, and the input value corresponds to a particular pixel value at a particular pixel location within a line of image data.

At step 302, a random number is generated. The random number is preferably a pseudo-random number that has an even distribution. As was described with respect to FIG. 1, the random number generated at step 302 is combined with an accumulated value to produce a combined value.

At step 304, the product is added to the combined value to produce a partial sum. At step 306, a portion of the partial sum is stored in a buffer as the new accumulated value, which will be used in the following combination iteration. The stored value in the buffer is a truncated version of the partial sum such that some of the data corresponding to the least significant bits is lost due to the truncation.

At step 308, it is determined whether or not all of the input values for this particular filtering operation have been included in the accumulated value. If a sufficient number of iterations have been performed such that all of the input values that will contribute to the eventual output value have been multiplied by their respective coefficients and added into the accumulated value, the method preferably proceeds to step 312.

If, however, additional input values must be received and multiplied by coefficients for addition to the accumulated value, the method proceeds to step 310. At step 310, the next input value and the next coefficient are loaded or selected in preparation for the subsequent iteration.

If it is determined at step 308 that all of the input values are included, and thus the accumulated values stores the final sum of all the coefficient and input products, the offset or level shift that was introduced by the addition of the random numbers in the iterations may be subtracted at step 312 from the accumulated value to produce an output. As stated earlier, this step may be negligible in terms of its alteration of the results, and thus may be eliminated from the method. Once the output value of the plurality of iterations has been captured, the buffer that stores the accumulated value is cleared at step 314 in preparation for the subsequent filtering operations.

Figure 5:
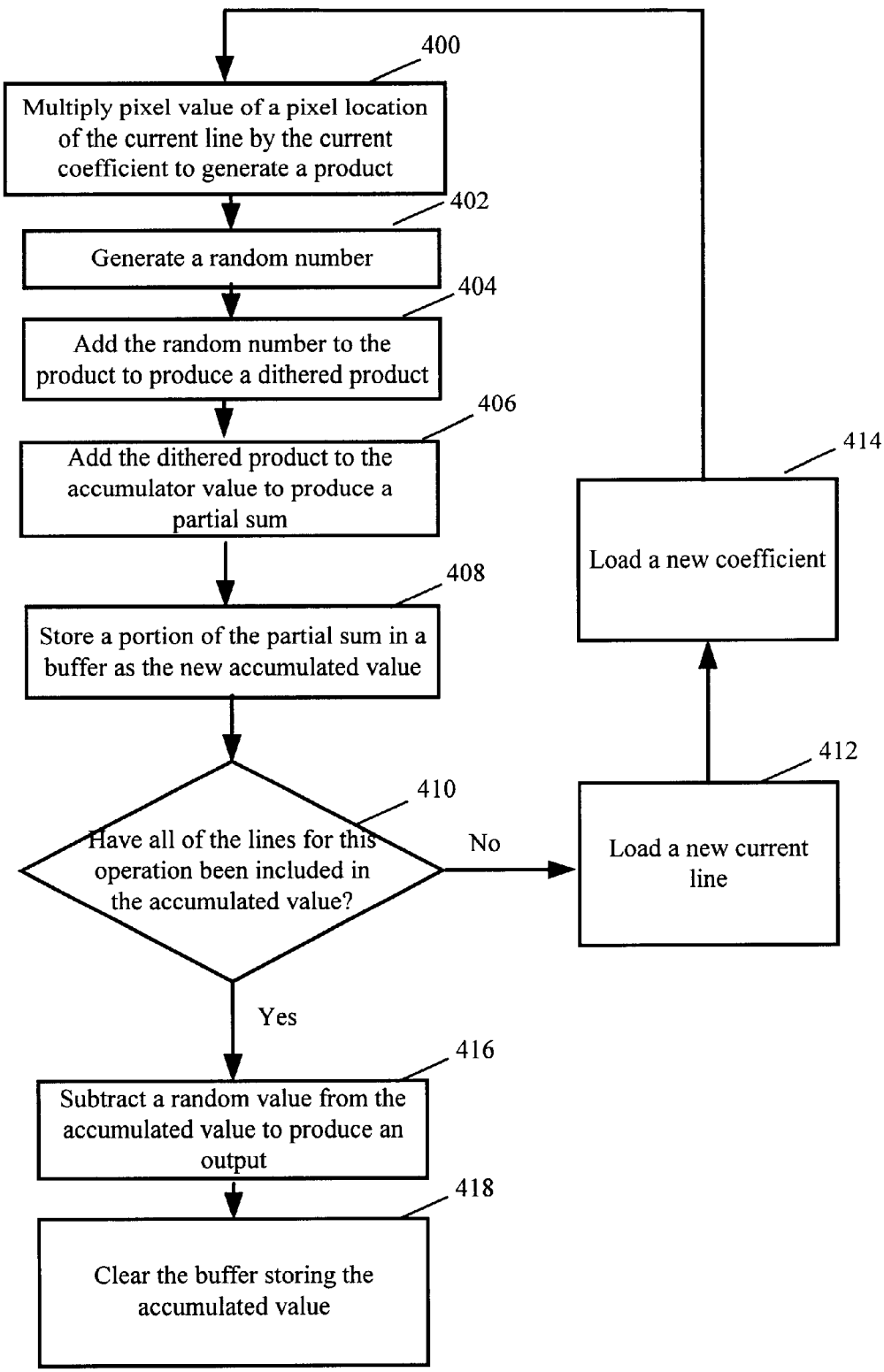
FIG. 5 illustrates a flow diagram of a method for filtering video data in accordance with the present invention.

FIG. 5 illustrates a method for filtering video data. The method begins at step 400 where a received pixel value corresponding to a particular pixel location of the current line is multiplied by the current coefficient to generate a product. Preferably, the method of FIG. 5 is utilized in a vertical scaling operation, and as such, the pixel value at a particular pixel location in each line that contributes to an eventual output filtered pixel in a filtered line will be multiplied by a coefficient to determine its contribution to the output pixel. The coefficients used to perform this multiplication operation may be stored in a register or a plurality of registers.

At step 402, a random number is generated, which as before is preferably a pseudo-random number having an even distribution. At step 404, the random number is added to the product to produce a dithered product. The dithering effect of the random number is such that a small amount of noise is induced in the signal to influence any eventual truncated values such that artifacts corresponding to truncation of ramping or other steadily changing functions is removed or effectively disguised.

At step 406, the dithered product is added to an accumulated value to produce a partial sum. Preferably, steps 404 and 406 are performed together in a single adder, where the accumulated value represents the higher order bits of one of the inputs to the adder, and the random number represents the lower ordered bits of that input. The other input is the product resulting from the multiplication operation at step 400.

At step 408, a portion of the partial sum resulting from the addition at step 406 is stored in a buffer as a new accumulated value. As such, the new accumulated value will be employed in a following iteration if one is to occur. At step 410, it is determined whether or not all of the lines that will contribute to this particular filtering operation have been included in the accumulated value. If not, the method proceeds to steps 412 and 414 where a new current line and a new coefficient are loaded, or received, for use in the following iteration.

If it is determined at step 410 that all of the lines for this particular filtering operation have been included in the accumulated value, the method proceeds to step 416. At step 416, a random value is subtracted from the accumulated value to produce an output. Preferably, the random value is equal to one-half of the maximum value of the least significant bit of the accumulated value. More preferably, the random value is derived from the random number used in the most recent combination operation. The output produced by subtracting this random value from the accumulated value is then provided as a portion of an output video data stream that has been filtered. At step 418, the buffer storing the accumulated value is cleared in anticipation of a subsequent filtering operation.

By including a small amount of noise in the filtering operation through the use of a random number generator, artifacts created by truncation of the partial sum in a partial sum filter can be eliminated or greatly reduced. This allows scalers and other filters to be produced with greatly reduced memory requirements, thus reducing cost and complexity of the circuits. This reduced amount of memory can produce a large cost savings in complex filters such as those used to perform scaling operations on video signals that include a large number of pixels.

It should be understood that the implementation of other variations and modifications of the invention and its various aspects will be apparent to those of ordinary skill in the art, and that the invention is not limited to the specific embodiments described. It is therefore contemplated to cover by the present invention, any and all modifications, variations, or equivalents that fall within the spirit and scope of the basic underlying principles disclosed and claimed herein.

What is claimed is:

1. A partial sum filter block comprising:
   a multiplier, wherein the multiplier receives a coefficient value and an input value, wherein the multiplier multiplies the coefficient value by the input value to produce a product;
   a random number generator that generates a random value;
   a first adder operably coupled to the multiplier and the pseudo random number generator, wherein the first adder combines the product with the random value and an accumulated value to produce a partial sum; and
   a buffer operably coupled to the first adder, wherein the buffer stores a portion of the partial sum as the accumulated value.

2. The partial sum filter block of claim 1 further comprises a second adder operably coupled to the buffer and the random number generator, wherein the second adder subtracts at least a portion of the random value from the accumulated value to produce an output signal.

3. The partial sum filter block of claim 1, wherein the buffer is an m-bit buffer, wherein the input value is at least m-bits.

4. The partial sum filter block of claim 3, wherein the buffer receives a clear signal, wherein the buffer is cleared by assertion of the clear signal.

5. The partial sum filter block of claim 4, wherein the input value corresponds to an element of a video signal.

6. The partial sum filter block of claim 5, wherein the partial sum filter block is included in a vertical scaler of a video signal processing circuit.

7. A vertical scaling block for vertical scaling of a video signal comprising:
   a line buffer that stores a portion of the video signal; and
   a plurality of partial sum blocks operably coupled to the line buffer, wherein each of the partial sum blocks receives a component of the portion of the video signal stored in the line buffer, wherein each of the partial sum blocks includes:
      a multiplier, wherein the multiplier receives a coefficient value and the component of the portion of the video signal, wherein the multiplier multiplies the coefficient value by the component portion to produce a product;
      a random number generator that generates a random number;
      a first adder operably coupled to the multiplier and the random number generator, wherein the adder combines the product with the random number and an accumulated value to produce a partial sum; and
      a buffer operably coupled to the first adder, wherein the buffer stores a portion of the partial sum as the accumulated value.

8. The vertical scaling block of claim 7, wherein each of the partial sum blocks further comprises a second adder operably coupled to the buffer and the random number generator, wherein the second adder subtracts at least a portion of the random number from the accumulated value to produce an output signal.

9. The vertical scaling block of claim 7 further comprises an output block operably coupled to the plurality of partial sum blocks, wherein the output block captures the output of each partial sum block after a predetermined number of combination iterations, wherein the buffer of each partial sum block is cleared after the output corresponding to the buffer has been captured.

10. A method for generating a partial sum filter coefficient, comprising:
    (a) multiplying a coefficient value and an input value to produce a product;
    (b) generating a random number;
    (c) adding the product to a combination of the random number and an accumulated value to produce a partial sum; and
    (d) storing a portion of the partial sum in a buffer as the accumulated value.

11. The method of claim 10, further comprises repeating steps (a)–(d) for a plurality of coefficient values and a plurality of input values using a plurality of random numbers, wherein the accumulated value resulting from multiple iterations is provided as an output.

12. The method of claim 11 further comprises subtracting at least a portion of the random number from the accumulated value to produce the output.

13. The method of claim 12, wherein the buffer is cleared following the multiple iterations.

14. The method of claim 13, wherein the buffer stores m-bits of the partial sum, wherein the m-bits correspond to most significant bits of the partial sum.

15. The method of claim 14, wherein the portion of the random number subtracted from the accumulated value has a maximum value of one half of a value corresponding to a maximum value of a least significant bit of the accumulated value.

16. A method for filtering video data comprising:
    repeating, for a plurality of input lines, a combination operation that includes:
       for a pixel location in an input line, multiplying a pixel value at the pixel location by a coefficient value to produce a product, wherein the coefficient value is determined based on the input line;
       generating a random number;
       adding the random number to the product to produce a dithered product;
       adding an accumulated value to the dithered product to produce a partial sum; and
       storing a portion of the partial sum in a buffer as the accumulated value; and
    after the combination operation has been repeated a predetermined number of iterations, providing the accumulated value as a scaled output.

17. The method of claim 16 further comprises, after providing the scaled output, clearing the buffer storing the accumulated value.

18. The method of claim 17, wherein providing the accumulated value as the scaled output further comprises subtracting a random value from the accumulated value to produce the scaled output.

19. The method of claim 18, wherein the random value is derived from a recently generated random number used in the combination operation.

20. The method of claim 16, wherein adding the random value and the accumulated value to the product are performed together in an adder, wherein one input to the adder is the product, wherein another input to the adder is a combination of the accumulated value and the random value, wherein the random value makes up the least significant portion of the combination and the accumulated value makes up the most significant portion of the combination.

* * * * *